(12) United States Patent
Yang et al.

(10) Patent No.: US 8,407,559 B2
(45) Date of Patent: Mar. 26, 2013

(54) MONITORING MEMORY

(75) Inventors: Xueshi Yang, Sunnyvale, CA (US); Zining Wu, Los Altos, CA (US); Pantas Sutardja, Los Gatos, CA (US)

(73) Assignee: Marvell World Trade Ltd. (BB)

(*) Notice: Subject to any disclaimer, the term of this patent is extended or adjusted under 35 U.S.C. 154(b) by 807 days.

(21) Appl. No.: 12/476,683

(22) Filed: Jun. 2, 2009

(65) Prior Publication Data

US 2009/0319825 A1 Dec. 24, 2009

Related U.S. Application Data

(60) Provisional application No. 61/074,408, filed on Jun. 20, 2008.

(51) Int. Cl.
*G11C 29/00* (2006.01)

(52) U.S. Cl. .......................................................... 714/763
(58) Field of Classification Search ................... 714/763
See application file for complete search history.

(56) References Cited

U.S. PATENT DOCUMENTS

| | | | |
|---|---|---|---|
| 2008/0106936 A1 | 5/2008 | Yang et al. | |
| 2008/0130364 A1* | 6/2008 | Guterman et al. | 365/185.09 |
| 2008/0239851 A1* | 10/2008 | Lin | 365/222 |
| 2009/0044190 A1* | 2/2009 | Tringali et al. | 718/102 |

* cited by examiner

*Primary Examiner* — Albert Decady
*Assistant Examiner* — Enam Ahmed

(57) ABSTRACT

Devices, systems, methods, and other embodiments associated with monitoring memory are described. In one embodiment, a method determines a first data quality associated with a set of data stored in flash memory. Based, at least in part, on the first data quality, the flash memory is controlled to correct the set of data to produce a corrected set of data. The corrected set of data is reprogrammed into the flash memory.

18 Claims, 6 Drawing Sheets

MONITORING MEMORY

CROSS REFERENCE TO RELATED APPLICATIONS

This application claims the benefit of U.S. provisional application Ser. No. 61/074,408 filed on Jun. 20, 2008, and is hereby wholly incorporated by reference herein.

BACKGROUND

Digital data is stored and retrieved from memory. Flash memory is a high density memory capable of storing large amounts of data on a single chip. Flash memories are implemented with many memory cells where each cell includes a floating transistor gate. Each memory cell is used to store one or more bits of data.

To erase data on a memory cell, a proper bias is applied to the transistor. After a threshold number of program and erases cycles, the transistor may no longer be able to be reliably programmed or erased, resulting in program failure or data loss. Traditionally, wear leveling algorithms have evened out the erase and programming cycles to extend the lifetime of a flash memory. However, the data in the flash memory may become unrecoverable when the flash memory is under the stress of many read operations or after an extended period of time since the data was last written. Thus relying on the evening out of program and erase cycle alone may not be sufficient to guarantee data reliability. A better way to monitor memory and evaluate its conditions is desired.

SUMMARY

One embodiment includes a method. The method determines a first data quality associated with a set of data stored in flash memory. Based, at least in part, on the first data quality, the flash memory is controlled to correct the set of data to produce a corrected set of data. The corrected set of data is reprogrammed into the flash memory.

Another embodiment includes an apparatus. The apparatus is comprised of data quality logic and flash reprogramming logic. The data quality logic monitors a data quality of a block of flash memory. The flash reprogramming logic reprograms the block of flash memory upon determining that the data quality of the block of flash memory has met a first threshold.

Another embodiment includes an apparatus. The method tracks and stores a number of errors corrected for individual memory blocks in a memory. If the number of errors corrected for a selected memory block meets a threshold, the selected memory block is tagged for corrective action prior to the selected memory block failing to operate. For memory blocks that have been tagged for corrective action, data stored in the tagged memory blocks is moved to new memory locations. The memory is controlled to prohibit subsequent use of the tagged memory blocks.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
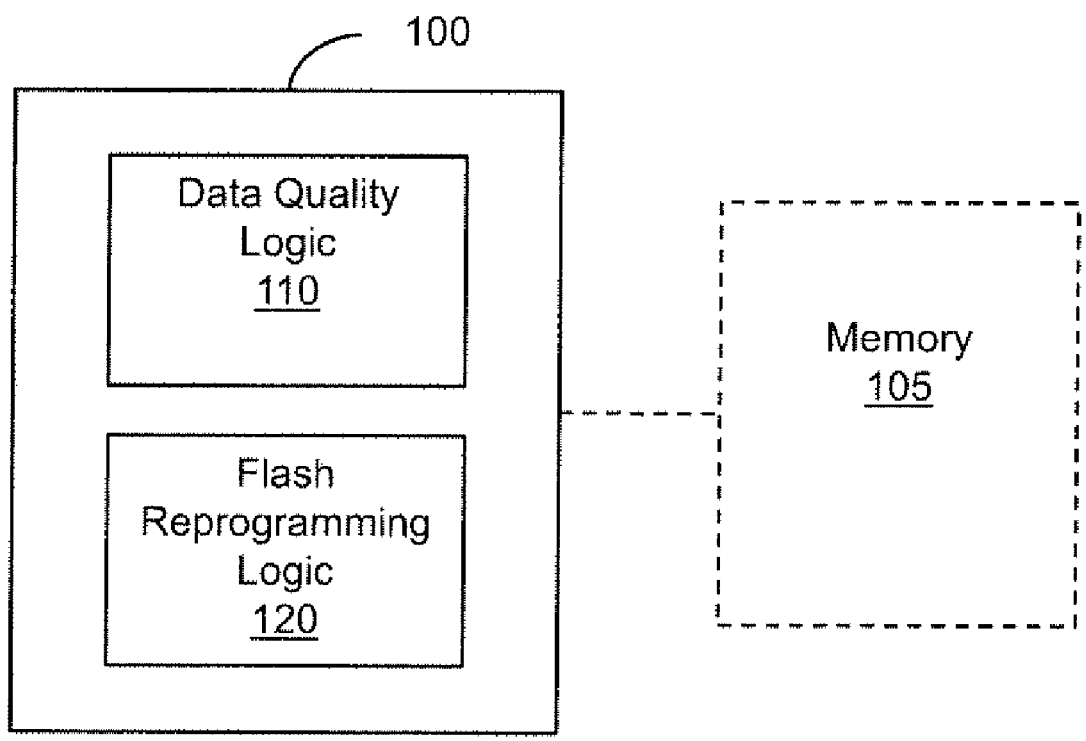
FIG. 1 illustrates one embodiment of an apparatus associated with monitoring memory.

Described herein are example systems, methods, and other embodiments associated with monitoring memory and/or controlling memory. In one embodiment, an apparatus is configured to monitor a memory and provide early data failure detection and prevention. In one example, the memory is a flash memory. Preventative measures are taken to prevent the data quality of any particular block of data from meeting a first quality threshold. It will be appreciated that the apparatus can be implemented where a threshold is met or satisfied in a number of ways. For example, meeting a threshold can occur when the data quality is less than the threshold, less than or equal to the threshold, greater than the threshold, or greater than or equal to the threshold. The implementation may depend on the values selected for the threshold and the type of comparison performed. Of course, other implementations can be used.

It will be appreciated that "meeting the threshold" indicates that the quality of the data of a block of data has deteriorated to a pre-designated warning value or level (e.g. equal to or exceeding above or below), which may be undesirable. For example, voltage levels used to represent one or more bits in the block of data may have drifted from non-ideal values. One preventative measure includes reprogramming the memory when the data quality of a block meets the first quality threshold. In this manner, the reprogramming corrects the data quality and thus prevents the data quality of any particular block of data from deteriorating to a possible failure point. Additionally, a number of erase and/or program cycles is tracked and compared to a second threshold when the data quality meets the first quality threshold. The block of data is marked as a bad block upon detecting that the erase and program cycles meet the second quality threshold.

In one embodiment, the block of data is relocated to a new location upon the block being marked as bad. In other embodiments, the block of data may be marked as bad and moved before or after the erase and program cycles meets the second quality threshold. The data relocation is performed before the memory location falls to operate. By relocating the block of data before the memory location fails, a failure of the memory location and/or the loss of the block of data can be prevented.

In another embodiment, the apparatus is configured to reprogram a memory block upon determining that the data quality of the block meets a first threshold. The apparatus, additionally, marks a flash memory location where the block is stored as bad upon determining that the block has experienced a number of erase and program cycles that meet a second threshold amount of erase cycles and program cycles. The apparatus moves the block of data to a different location upon determining that the block has met a second threshold amount of erase cycles and program cycles.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, and other media from which a computer, a processor or other electronic device can read.

"Logic", as used herein, includes but is not limited to hardware, firmware, software stored or in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include at least one circuit, one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Block", as used herein, includes but is not limit to a group of cells that are programmed or erased as an entity. For example, a block can refer to a physical page in a NAND flash memory device. Alternatively, a block may comprise a group of flash memory pages. A block may also correspond to other memory components, structures, and/or memory architectural units as understood by those with ordinary skill in the art.

FIG. 1 illustrates one embodiment of an apparatus 100 associated with monitoring and controlling a memory 105. The apparatus 100 is configured to prevent the loss of data in, for example, a flash memory 105 by monitoring data quality of individual blocks of memory. A memory block is suspected to be going bad upon detecting that the data quality of the block has met a threshold value. In one example, when the data quality falls below the threshold value (e.g. meets or exceeds the threshold), the data quality will meet the threshold value. In response, the apparatus 100 rewrites the data in the block.

In another embodiment, the apparatus 100 also tracks the number of erase cycles and/or program cycles that are applied to individual blocks. A block is proactively marked as bad upon determining that the number of erase cycles and program cycles to the block meets a second threshold value. In one example, the second threshold value is met when the number of erase cycles and program cycles to the block meets or exceeds the second threshold value. This condition occurs before a memory location actually fails to operate. In one embodiment, a block status table is maintained to indicate a status for individual blocks. A status bit in the block status table corresponding to one block of memory may be set to indicate that the block is bad. Proactively moving data from a bad block to a new location before a failure occurs reduces the risk of data loss since the data may not be recoverable after an actual failure occurs in the memory location.

In one embodiment, the apparatus 100 comprises data quality logic 110 that monitors a data quality of a block from the flash memory 105. The data quality logic 110 monitors a group of flash memory cells that can store more than one data bit. For example, a group of memory cells can form a page in the memory device. In one embodiment, the data quality is a count of the number of bit errors on the page of flash memory. The data quality may include other measurements. For example, the data quality may be an indication of how well a group of capacitors represents corresponding two bit values in group of multiple level cells (MLCs). The data quality logic 110 is not restricted to monitoring a page of memory. For example, the data quality logic 110 can be configured to measure the data quality of a block of memory, a bank of memory, or a page of memory, as well as memory of other sizes and organizations. In these embodiments, the data quality is measured in other ways. For example, the data quality may be measured by determining how many parity violations are detected for an encoded stored in a block of memory.

The apparatus 100 comprises flash reprogramming logic 120 to reprogram the block. The block is reprogrammed upon determining that the data quality of the block meets a first threshold. In one embodiment, the first threshold corresponds to a number of errors acceptable in the block of memory. The first threshold may also represent a number of unacceptable bit values in a group of MLCs. The first threshold can also be set to represent other values related to the data quality.

In one embodiment, when the data quality meets the first threshold, the reprogramming logic 120 is configured to reprogram the block of data. The block of data can be reprogrammed locally to a same original block or to another block. If the reprogramming logic 120 reprograms the block of data locally, the original block is erased and reprogrammed with the corrected read back data. If the reprogramming logic 120 reprograms the block of data to an alternative block, an available block is assigned by the apparatus 100 to store the corrected data and the original data block is marked as invalid. The reprogramming logic 120 then reprograms the block of data to the different alternate block. The original memory block may still be used later by erasing and reprogramming the original block.

The apparatus 100 comprises data relocation logic that marks a flash memory location where the block is stored as bad. The flash memory location is marked as bad (e.g., no longer should be used) upon determining that the block has met a second threshold amount of erase cycles and/or program cycles. The second threshold is set to indicate that the block might be approaching a failing point. Thus the condition of "bad" means that a certain number cycles have occurred in a memory location, which is used to predicate that a failure could occur, but the memory location has not yet failed and is still operable. Marking the flash memory location as bad can prevent the loss of data because the flash memory location is marked as bad before the flash memory location fails to operate. The apparatus 100 is configured to control the flash memory so that no other data may be written or programmed to a flash memory location that is marked as bad. Marking the block as bad preemptively removes the block from operation before the block actually fails and data in the block is lost.

In one embodiment, after data quality logic 110 determines that the first threshold has been met, the apparatus 100 determines whether the second threshold has been met. The apparatus 100 determines whether the current block needs to be marked bad based, at least in part, on whether the second threshold has been met. If the second threshold also has been met, the apparatus 100 marks the block as bad. The apparatus 100 will not use the block after the block is marked as bad. The apparatus 100 will correct errors in the block of data as discussed below. After the errors are corrected, the data relocation logic moves the block of data from the bad location to a different location. The data will be programmed to another new block when the second threshold has been met. For example, the different memory location may be in the same flash memory or external to the flash memory. If the second threshold was not met, the reprogramming logic 120 may reprogram the block of data to the same block after erasing the block and then reprogramming the block with the same block of data. Alternatively, if the second threshold was not met, the relocation logic and reprogramming logic 120 may still program the data to another block.

In one embodiment, the apparatus 100 is configured to correct bit errors in the flash memory. The data quality logic 110 sets the first threshold to an integer value below a number of bit errors the apparatus 100 is capable of correcting. For example, if the apparatus 100 is able to correct five errors (which is dependent on the error correction algorithm used), then the first threshold is set to four, three, two, or one. The apparatus 100 corrects errors upon the data quality meeting the first threshold. The apparatus 100 implements suitable error correction algorithms. For example, the apparatus 100 may implement an error correction algorithm based on BCH (Bose-Chaudhuri-Hocquenghem) codes, and/or a low density parity check (LDPC) algorithm. In different embodiments, data quality logic 110, flash reprogramming logic 120, and data relocation logic are configured to perform the error correction actions.

In another embodiment, the apparatus 100 detects errors in the memory. For example, the flash reprogramming logic 120 determines if the data quality of a block has met a first threshold responsive to the apparatus 100 detecting an error. The block is reprogrammed when the data quality is determined to have met the first threshold. In one embodiment, the error is corrected without reprogramming the block.

In another embodiment, the data quality logic 110 periodically monitors the data quality of a block of flash memory. For example, the data quality logic 110 monitors the data quality of the block of flash memory responsive to a software program, a hardware sensor, and/or a user. The data quality logic 110 can also be configured to monitor the data quality of blocks responsive to other indicators, conditions of the memory, trigger events, and so on.

In some embodiments, the apparatus 100 may comprise or implement other useful features. For example, the first threshold and the second threshold may be programmable. In another embodiment, the apparatus 100 is located in a chip. A chip is a set of micro-miniaturized electronic circuits fabricated on a semiconductor material. The chip may be a flash memory chip.

Figure 2:
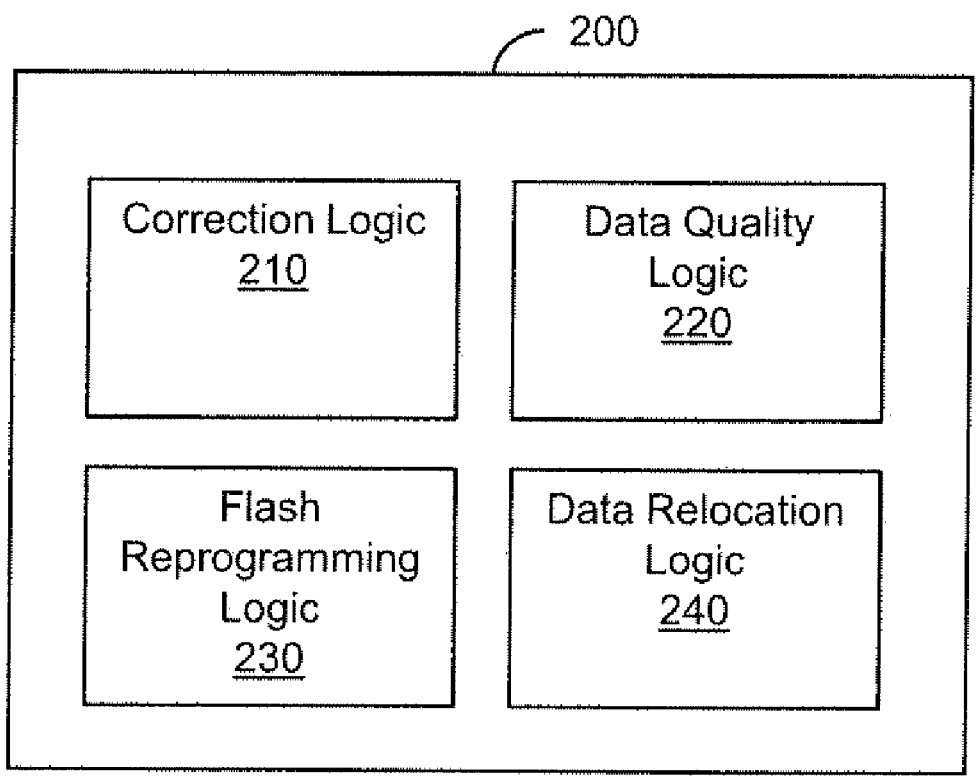
FIG. 2 illustrates another embodiment of an apparatus associated with monitoring memory.

FIG. 2 illustrates another embodiment of an apparatus 200 that monitors and controls memory. The apparatus 200 is similar to apparatus 100 of FIG. 1 but further comprises correction logic 210. Correction logic 210 is configured to correct bit errors in a block of flash memory. The correction logic 210 corrects errors in pages of memory, blocks of memory, or other units of memory. As discussed above and in one embodiment, the errors are corrected by a BCH code, LDPC and/or other suitable correction method.

The apparatus 200 also comprises data quality logic 220 that is similar to data quality logic 110 of FIG. 1, flash reprogramming logic 230 that is similar to flash reprogramming logic 120 of FIG. 1, and data relocation logic 240 for monitoring a data quality of a block of flash memory as discussed above. For example, the data quality logic 220 may determine a number of bit errors in the flash memory.

In one embodiment, the flash reprogramming logic 230 reprograms a block upon the data quality logic 220 determining that the data quality of the block has met a first threshold. In one embodiment, the first threshold is pre-designated as a value below a number of bit errors the correction logic 220 is capable of correcting. The first threshold may be an indication of the data quality of the block. For example, meeting the first threshold indicates that the quality of the data is becoming bad (e.g. data could possibly have errors or the memory block could fail to operate properly). As discussed above, the first threshold may be a number of errors, an indication of how well MLC bit values are represented, as well as other values that represent an acceptable data quality level. The block of data can be reprogrammed locally to a same original block or to another block. If the reprogramming logic 230 reprograms the block of data locally, the original block is erased and reprogrammed with the corrected read back data. If the reprogramming logic 230 reprograms the block of data to an alternative block, an available block is assigned by the relocation logic 240 to store the corrected data and the original data block is marked as invalid. The corrected data is programmed to the available block by the reprogramming logic 230. The original memory block may still be used later by erasing and reprogramming the original block.

In one embodiment, after data quality logic 220 determines that the first threshold has been met, the apparatus 200 determines whether the second threshold has been met. The second threshold is a pre-designated warning value or level that indicates that the block has nearly reached a failing point. The apparatus 200 determines whether the current block should be marked "bad" based, at least in part, on whether the second threshold has been met. If the second threshold has also been met, the apparatus marks the block as "bad." Marking the block as bad preemptively removes the block from operation before the block fails and data in the block is lost. The apparatus 200 will not use the block after the block is marked as bad. The apparatus 200 will correct errors in the block of data as discussed above. After the errors are corrected, the data relocation logic 240 moves the block of data from the bad location to a different location. The data will be programmed to another new block when the second threshold is met. For example, the different memory location may be in the same flash memory or external to the flash memory. If the second threshold was not met, the reprogramming logic 230 may reprogram the block of data to the same block after erasing the block and then reprogramming the block with the same block of data. Alternatively, if the second threshold was not met, the relocation logic 240 and reprogramming logic 230 may still program the data to another block.

Figure 3:
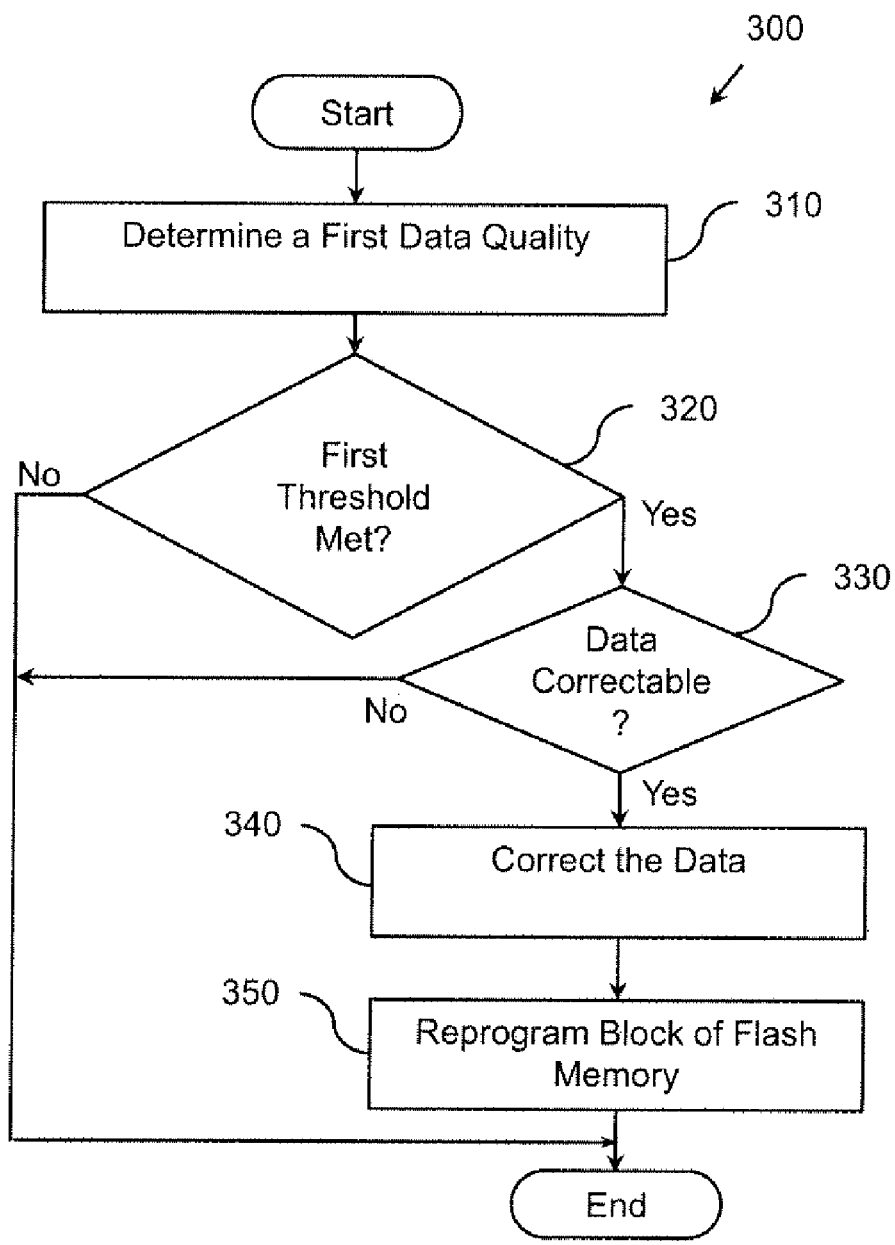
FIG. 3 illustrates one embodiment of a method associated with monitoring memory.

FIG. 3 illustrates an example method 300 associated with monitoring memory and handling early failure detection. The method 300 improves the reliability of a memory by monitoring the data quality of the memory and moving blocks of data to new locations when an area of memory is determined to be unreliable, but before a failure occurs.

At 310, the method 300 determines a first data quality associated with a memory region stored in a flash memory. The memory region may be a block of memory, a bank of memory, a line of memory, a page of memory, or another region of memory. The first data quality may be an indication of a number of errors, an indication of how well MLC bit values are represented, as well as other values that may indicate how well the data of the memory region is stored in the memory. In another embodiment, the determining block 310 includes detecting one or more errors associated with the data in the memory region and then determining the first data quality based at least in part on information from the detected errors (e.g. a number of data errors, type of errors, and so on).

In one embodiment, the determining action at 310 is performed periodically. In another embodiment, the determining action at 310 is initiated by software program, a hardware sensor, or a user.

The method 300 determines, at 320, if the first data quality has met a first threshold. In one embodiment, the first threshold is set to a value of a number of bits a correction algorithm is capable of correcting. If the number of errors of the data quality does not meet the first threshold, the method 300 ends because the data quality is good. In one embodiment, the method 300 may periodically begin again and determine the first data quality at 310. In one embodiment, the data of the memory region is reprogrammed upon determining that the data quality has met the first threshold. Reprogramming improves data quality even though data errors may not have been detected.

At 330, a determination is made concerning whether the data in the memory region is correctable by the flash memory. If the determination at 330 is yes, then the flash memory is controlled, at 340, to correct the data. If the data quality met the first threshold and the data is uncorrectable, the method 300 ends because the data is uncorrectable. In some embodiments a report that the data is uncorrectable is generated and sent to a device that will take appropriate action when the data quality meets the first threshold. In some embodiments, the flash memory corrects the data represented by the memory region based on a correction algorithm. The correction algorithm may comprise a BCH algorithm, a low density parity check (LDPC) algorithm, and/or another correction algorithm. After the data is corrected, the method reprograms, at 350, the data to the memory region. The data may be reprogrammed to the previous memory region or to a different memory region as discussed above.

In one embodiment, the method 300 determines if the number of erase cycles and program cycles meet a cycle threshold. If the erase cycles and program cycles meet the cycle threshold, the memory region of the flash memory is marked as bad and the data in the memory region is moved to a different location. In one embodiment, a report is sent to a device that will take appropriate action when the memory location is marked as bad. Marking the block as bad preemptively removes the block from operation before the block fails and data in the block is lost. The block of data is not used after the block is marked as bad. The threshold amount of erase cycles and program cycles may indicate that the block has nearly reached a failing point.

In different embodiments, the data of the memory region is stored in a second memory location in the flash memory or to a second memory location external to the flash memory. In one embodiment, the data in the same memory region is reprogrammed upon determining that the data in the memory region met the threshold amount of erase cycles and program cycles. In one embodiment, future accesses to the marked portion of the flash memory are prohibited.

In one embodiment, a chip is configured to perform the method 300. The chip includes at least one electrical circuit fabricated on semiconductor material. In one embodiment, the chip is a flash memory chip. In one example, the flash memory chip is a multiple level cell (MLC) flash memory.

Figure 4:
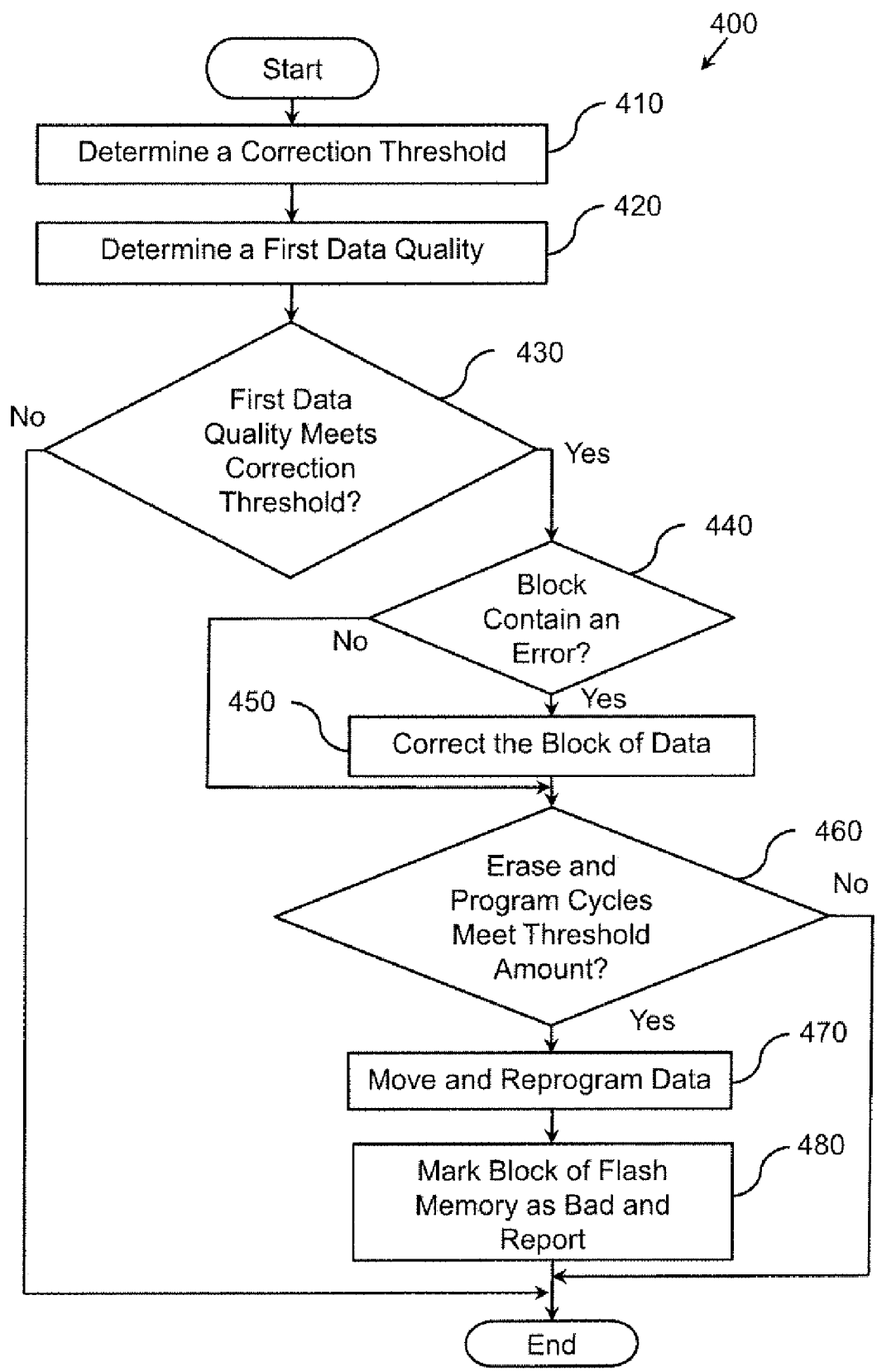
FIG. 4 illustrates another embodiment of a method associated with monitoring memory.

FIG. 4 illustrates an example method 400 associated with monitoring memory. The method 400 comprises determining at 410 a correction threshold. The correction threshold is associated with error correction logic in a flash memory. The correction threshold is a positive number less than a number of errors that the error correction logic is capable of correcting. One skilled in the art will appreciate that other approaches to determining whether a threshold is exceeded may be employed. The error correction logic is capable of correcting errors by a, BCH, an ECC algorithm, an LDPC algorithm, or other suitable algorithms.

The method 400 determines at 420 a first data quality. The first data quality is associated with a block of data stored in the flash memory. The first data quality may be a number of errors in the first block of data. In other embodiments, the block of data may be a line of data, a page memory, or another unit of memory. In one embodiment, determining a first data quality occurs in response to an error being detected by error correction logic in the block of memory.

The method 400 determines, at 430, whether the first data quality meets the correction threshold. At 440, a determination is made whether the block of data contains an error. Upon determining that the first data quality meets the correction threshold and that the block of data contains an error, the flash memory is controlled, at 450, to correct the block of data.

The method 400 determines, at 460, if the block of data has met a threshold amount of erase cycles and program cycles. The threshold amount of erase cycles and program cycles may indicate that the block has nearly reached a failing point. Upon determining that the block of data met the threshold amount of erase cycles and program cycles, the block of data is moved, at 470, to a different location. The data will be programmed to another new block when the threshold amount of erase cycles and program cycles is met. For example, the different memory location may be in the same flash memory or external to the flash memory. If the second threshold was not met, the block of data may be reprogrammed to the same block after erasing the block and then reprogramming the block with the same block of data. Alternatively, if the second threshold was not met, the block of data may be programmed to a different block.

The block of data is marked as bad, at 480, and a report is sent to a device that will take appropriate action. Marking the block as bad preemptively removes the block from operation before the block fails and data in the block is lost. The block of data is not used after the block is marked as bad.

It will be appreciated that in one embodiment, the methods herein may be implemented as computer executable instructions embodied and stored on a computer-readable medium. When executed by a machine (e.g., processor, device) the instructions cause the machine to perform the methods herein and their equivalents. The methods can also be implemented with circuits.

Figure 5:
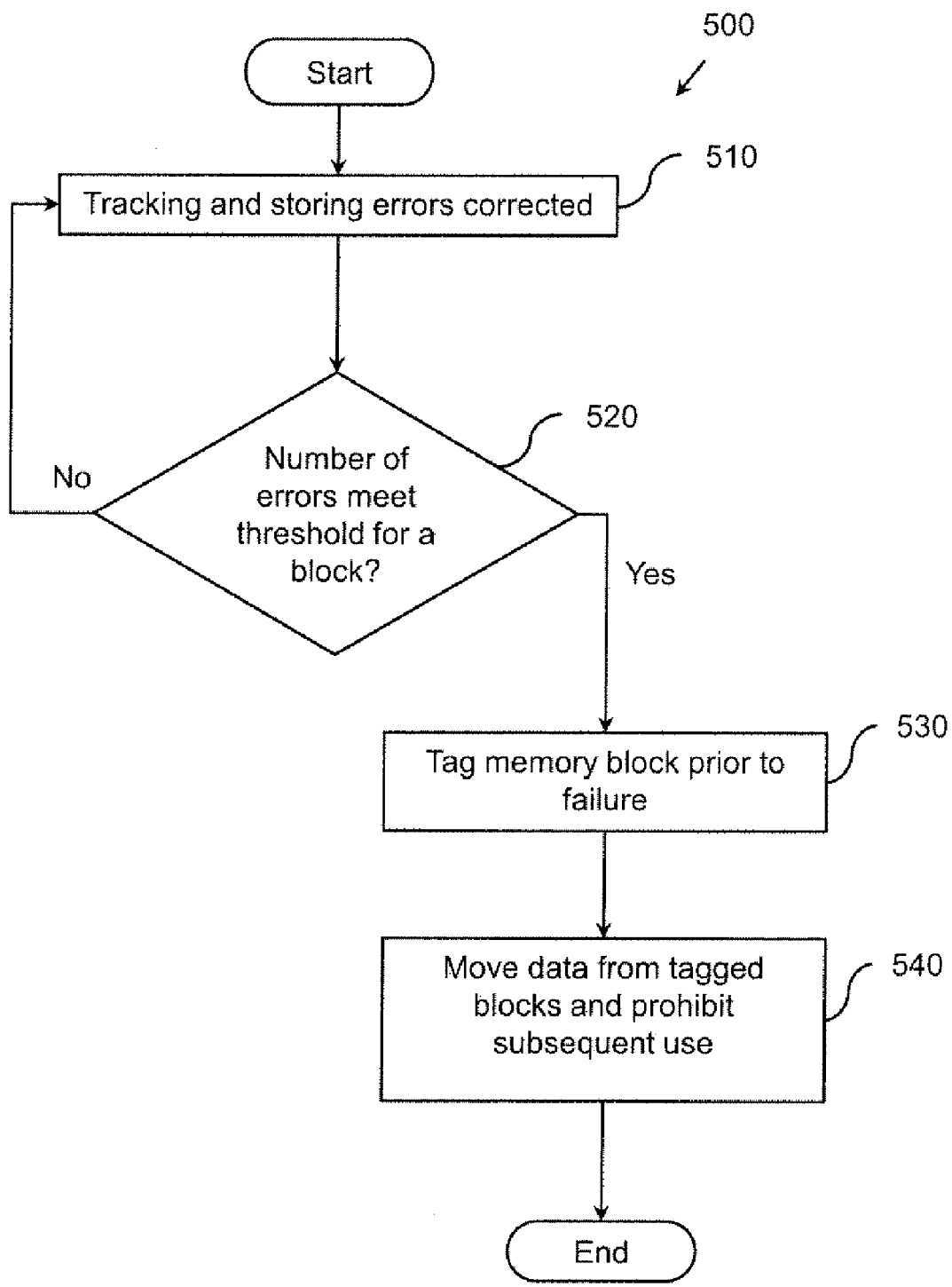
FIG. 5 illustrates another embodiment of a method associated with monitoring memory.

FIG. 5 illustrates another embodiment of a method 500 for controlling memory to provide early failure detection and control. The method is described with reference to a memory (e.g. a flash memory) that stores data in memory blocks. As errors occur in the memory and are corrected, the method 500 tracks and stores a number of errors corrected for individual memory blocks in the memory (block 510). If the number of errors corrected for a selected memory block meets a threshold (block 520), then the selected memory block is tagged for corrective action (block 530). The tagging is determined and performed prior to the selected memory block failing to operate. Thus the method forms a prediction that the memory block will likely fail in the near future even though it is still currently operable. For memory blocks that have been tagged for corrective action, data stored in the tagged memory blocks are moved or otherwise relocated to new memory locations (block 540). The memory is then controlled to prohibit subsequent use of the tagged memory blocks so that data is not written to them only to have the memory block fail at a later time. In this manner, proactive and preventative actions are taken to reduce data loss due to memory failures.

In another embodiment, the tracking and storing block 510 further includes tracking and storing a number of erase cycles and program cycles applied to the individual memory blocks. This is similar to that previously described. The tagging at 530 is then performed based at least in part on the number of errors corrected and the number of erase cycles and program cycles for the selected memory block. The numbers can be compared to thresholds as previously described.

In another embodiment, a block status table is maintained that indicates a status of individual memory blocks. Tagging the selected block for corrective action (block 530) further comprises setting a status for the selected block in the block status table. At block 540, the block status table can be read to identify which blocks have been tagged and the correction action is applied.

Figure 6:
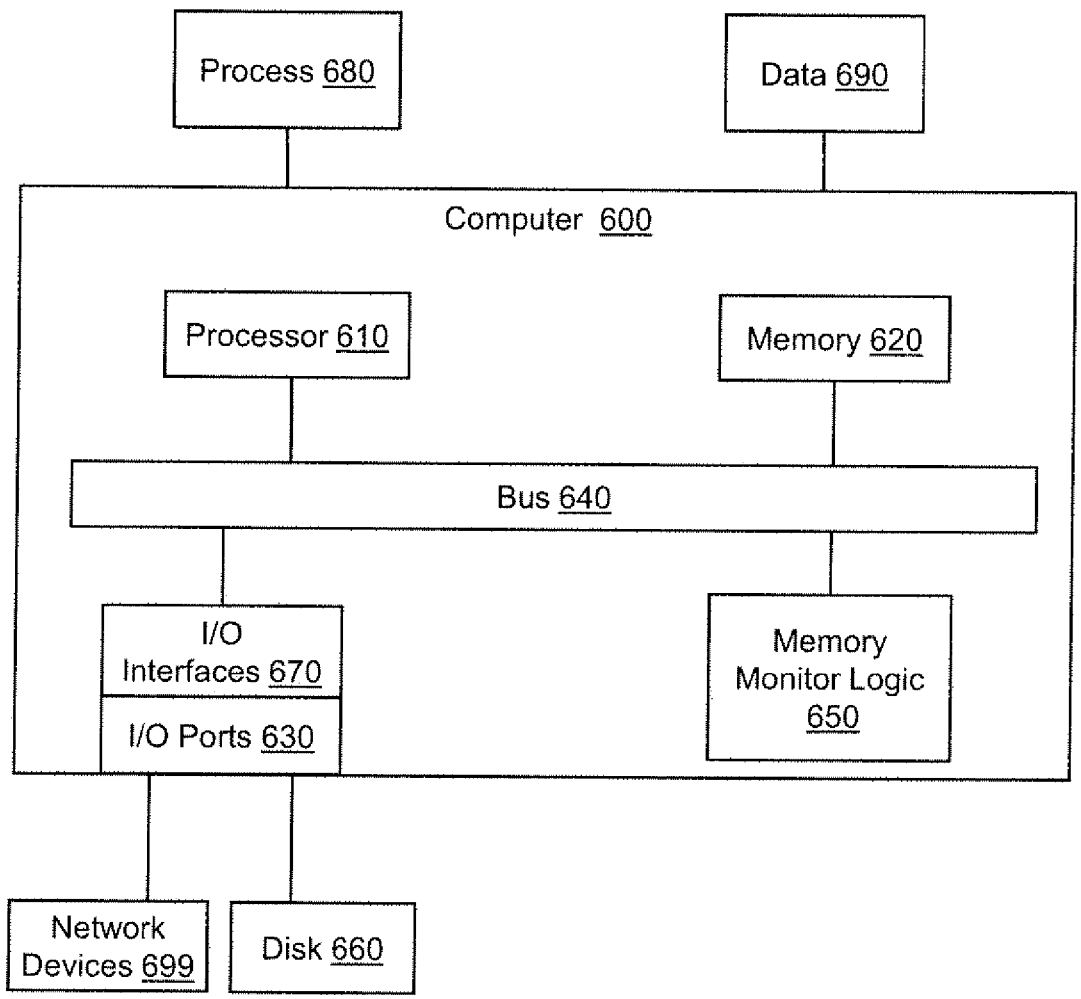
FIG. 6 illustrates an embodiment of a computing environment in which example systems and methods, and equivalents are associated with monitoring memory may operate.

FIG. 6 illustrates an example embodiment of a computing device in which example systems and methods described herein, and equivalents, are implemented. The example computing device is a computer 600 that includes a processor 610, a memory 620, and input/output ports 630 operably connected by a bus 640. In one example, the computer 600 includes a memory monitor logic 650 to monitor and access memory.

The memory monitor logic 650 provides means (e.g., hardware, stored software, firmware) for monitoring memory. The memory monitor logic 650 can be implemented similar to the apparatus 100 and 200, and/or combinations of their features. For example, the memory logic implemented similar to apparatusus 100 and 200 can monitor the memory 620 or other memories connected to the bus 640. The memory monitor logic 650 can include logic implemented, for example, as an ASIC or other type of circuit.

Generally describing an example configuration of the computer 600, the processor 610 may be a variety of various processors including single microprocessor, dual microprocessor, and other multi-processor architectures. A memory 620 may include volatile memory and/or non-volatile memory. Non-volatile memory may include, for example, read-only memory (ROM), programmable read only memory (PROM), erasable programmable read only memory (EPROM), electronically erasable programmable read only memory (EEPROM), phase change memory (PCM), and so on. Volatile memory may include, for example, random access memory (RAM), static random access memory (SRAM), dynamic random access memory (DRAM), and so on.

A disk 660 may be operably connected to the computer 600 via, for example, through an input/output interface (e.g., card, device) 670 and the input/output port 630. The disk 660 may be, for example, a magnetic disk drive, a solid state disk drive, a floppy disk drive, a tape drive, a Zip drive, a flash memory card, a memory stick, and so on. Furthermore, the disk 660 may be a compact disk read-only memory (CD-ROM) drive, a compact disk recordable (CD-R) drive, a compact disk rewritable (CD-RW) drive, a digital video disk read-only memory (DVD ROM), and so on. The memory 620 can store a process 680 and/or a data 690, for example. The disk 660 and/or the memory 620 can store an operating system that controls and allocates resources of the computer 600.

The bus 640 may be a single internal bus interconnect architecture and/or other bus or mesh architectures. While a single bus is illustrated, it is appreciated that the computer 600 may communicate with various devices, logics, and peripherals using other busses (e.g., peripheral component interconnect express (PCIE), 1394, universal serial bus (USB), Ethernet). The bus 640 can be types including, for example, a memory bus, a memory controller, a peripheral bus, an external bus, a crossbar switch, and/or a local bus.

The computer 600 may interact with input/output devices via the input/output (I/O) interfaces 670 including the memory monitor logic 650 and the input/output ports 630. Input/output devices may be, for example, a keyboard, a microphone, a pointing and selection device, cameras, video cards, displays, the disk 660, the network devices 699, and so on. The input/output ports 630 may include, for example, serial ports, parallel ports, and USB ports.

The computer 600 can operate in a network environment and thus may be connected to the network devices 699 via the I/O interfaces 670, and/or the I/O ports 630. Through the network devices 699, the computer 600 may interact with a network. Through the network, the computer 600 may be logically connected to remote computers. Networks with which the computer 600 may interact include, but are not limited to, a local area network (LAN), a wide local area network (WLAN), a wide area network (WAN), and other networks.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. A method, comprising:
   determining a first data quality associated with a set of data stored in a block of flash memory by comparing a number of errors corrected in the set of data to a first threshold;
   if the first threshold is met by the number of errors corrected based, at least in part, on the first data quality, then controlling the flash memory to correct the set of data to produce a corrected set of data; and
   reprogramming the corrected set of data into the flash memory; and
   after the reprogramming, if a number of erase cycles and program cycles to the set of data is determined to meet a second threshold, then moving the set of data from the block to a different location in the flash memory; and
marking the block as a bad block to avoid subsequent use of the block.

2. The method of claim 1, wherein the set of data is stored in the block of flash memory, and where the corrected set of data is reprogrammed to the block of flash memory.

3. The method in claim 1, further comprising:
determining the number of the erase cycles and program cycles.

4. The method of claim 1, wherein the set of data is reprogrammed to a different block of flash memory upon marking the block of flash memory as bad.

5. The method of claim 1, further comprising prohibiting future access to the marked block of the flash memory.

6. The method of claim 1, further comprising:
determining the number of erase cycles and program cycles; and
reprogramming the set of data based, at least in part, on the number of erase cycles and program cycles determined.

7. The method of claim 1, wherein the reprogramming of the set of data is further based, at least on part on the number of erase and program cycles meeting a threshold.

8. The method of claim 1, wherein the first threshold is a value that is smaller than a number of bits an error correction algorithm, that is implemented for the flash memory, is capable of correcting.

9. The method of claim 1 further comprising:
marking the memory block as bad and prohibiting future usage of the memory block.

10. The method of claim 1, further comprising:
determining that the set of data is correctable when the first data quality does not meet the first threshold.

11. The method of claim 1, where determining the first data quality associated with the set of data is performed periodically.

12. The method of claim 1, where reprogramming the set of data includes storing the set of data into a second block of flash memory.

13. The method of claim 1, where reprogramming the set of data includes storing the set of data into the same block of flash memory.

14. An apparatus, comprising:
data quality logic configured to monitor a data quality of a block of flash memory, wherein the data quality logic is configured to
determine the data quality associated with the block of flash memory by comparing a number of bit errors in the block to a first threshold;
if the first threshold is met by the number of bit errors, then
determining if a number of erase cycles and program cycles performed on the block of flash memory meets a second threshold;
flash reprogramming logic configured to, upon determining that the first threshold and the second threshold are met:
reprogram data in the block of flash memory;
move the reprogrammed data from the block to a different location in the flash memory; and
mark the block as a bad block to avoid subsequent use of the block.

15. The apparatus of claim 14, wherein the flash reprogramming logic further comprising:
data relocation logic to mark the block of flash memory as bad upon determining that the block of flash memory meets both the first threshold and the second threshold.

16. The apparatus of claim 14, further comprising:
correction logic to correct bit errors in the block of flash memory, where the data quality logic sets the first threshold to an integer value representing a number of bit errors the correction logic is capable of correcting, and where the correction logic corrects errors upon determining that the data quality meets the first threshold.

17. A method, comprising:
counting and storing a number of errors corrected for individual memory blocks in a memory;
counting and storing a number of erase cycles and program cycles applied to the individual memory blocks;
if the number of errors corrected for a selected memory block meets a threshold, tagging the selected memory block for corrective action prior to the selected memory block failing to operate; and
for memory blocks that have been tagged for corrective action, if the number of erase cycles and program cycles applied to the tagged memory block meets a second threshold, then:
moving data stored in the tagged memory blocks to new memory locations and controlling the memory to prohibit subsequent use of the tagged memory blocks including marking the tagged memory block as a bad block.

18. The method of claim 17, further comprising:
maintaining a block status table that indicates a status of individual memory blocks; and
where tagging the selected block for corrective action comprises setting a status for the selected block in the block status table.

* * * * *